(12) United States Patent
Yoshitake et al.

(10) Patent No.: US 6,584,332 B2
(45) Date of Patent: Jun. 24, 2003

(54) ELECTRONIC EQUIPMENT

(75) Inventors: Tsutomu Yoshitake, Tokyo (JP);
Wataru Hattori, Tokyo (JP)

(73) Assignee: NEC Corporation (JP)

( * ) Notice: Subject to any disclaimer, the term of this patent is extended or adjusted under 35 U.S.C. 154(b) by 353 days.

(21) Appl. No.: 09/738,191

(22) Filed: Dec. 15, 2000

(65) Prior Publication Data

US 2001/0004021 A1 Jun. 21, 2001

(30) Foreign Application Priority Data

Dec. 16, 1999 (JP) .......................................... 11-356792

(51) Int. Cl.[7] ................................................ H05K 7/20
(52) U.S. Cl. ............................ 505/210; 62/6; 333/995; 361/707; 455/561
(58) Field of Search ................................. 361/699, 700, 361/704, 705, 707; 505/210, 866; 343/890; 333/995, 202; 330/207 P, 289; 257/661, 712, 713, 729, 930; 62/6, 259.2; 455/140, 217, 277.1, 280, 561

(56) References Cited

U.S. PATENT DOCUMENTS 6,178,339 B1 * 1/2001 Sakai et al. .................. 505/210
6,205,340 B1 * 3/2001 Yandrofski et al. ......... 455/561
6,298,670 B1 * 10/2001 Pundak ............................ 62/6
6,314,309 B1 * 11/2001 Abdelmonem ............... 505/210
6,480,706 B1 * 11/2002 Mimura et al. .............. 455/140

FOREIGN PATENT DOCUMENTS

| JP | 63-306362 | 12/1988 | ............. F25B/9/00 |
| JP | 2-298765 | 12/1990 | ............. F25B/9/14 |
| JP | 4-194765 | 7/1992 | ......... G01R/33/035 |
| JP | 7-146020 | 6/1995 | ............. F25B/9/00 |
| JP | 10-126290 | 5/1998 | ............. H04B/1/10 |

* cited by examiner

Primary Examiner—Gerald Tolin
(74) Attorney, Agent, or Firm—Hayes Soloway P.C.

(57) ABSTRACT

An electronic equipment includes one or more electronic devices, a cold stage, and a cold insulation member. The one or more electronic devices perform a predetermined operation within a predetermined temperature range. The cold stage cools down the one or more electronic devices to a predetermined operational temperature at which the one or more electronic devices is operable. The phase transition temperature of the cold insulation member is in a range between the predetermined operational temperature and an upper limit of the predetermined temperature range. The cold insulation member is arranged adjacent to the one or more electronic devices, and retains the temperature of the one or more electronic devices within the predetermined temperature range. At least one electronic devices over which the cold insulation member is arranged is partially formed from a material which is in a superconductive state at the predetermined operational temperature.

15 Claims, 7 Drawing Sheets

ELECTRONIC EQUIPMENT

BACKGROUND OF THE INVENTION

1. Field of the Invention

The present invention relates to an electronic equipment, and, more particularly, to an electronic equipment having a device which is cooled down to an extremely low temperature so as to operate in a superconductive state.

2. Description of the Related Art

In recent years, radio receivers, with a high degree of reception sensitivity, for use at a mobile communications or satellite communications base station are developed.

For example, a radio receiver disclosed in Unexamined Japanese Patent Application KOKAI Publication No. H10-126290 employs a superconductor filter. In this radio receiver, a decrease in the loss of filter is achieved, as compared to any other conventional radio receivers.

In this radio receiver, a low-noise amplifier which amplifiers a signal output from a filter is operated at a low temperature, thereby to reduce thermal noise.

To have a high degree of reception sensitivity, the radio receiver of the above publication includes a cooler which cools down a superconductor filter and the low-noise amplifier to an extremely low temperature.

Because a band pass filter is formed from a superconductor filter, the radio receiver exhibits steep attenuation characteristics over a pass band, and the band pass filter is likely to select signals at a predetermined frequency band.

In the case where a radio receiver includes a superconductor filter, it is necessary to control the temperature of the band pass filter to be constant.

It is because the pass band frequency of the band pass filter is determined based on the inductance of a filter circuit, and the penetration depth of the superconductor having an effect on the inductance changes depending on the temperature of the band pass filter.

Hence, there is employed a method for controlling the electric power to be supplied to the cooler, for example, while monitoring the temperature of the band pass filter.

While the cooler included in the radio receiver continues to operate for a long period of time, the level of the electric power to be input to the cooler may change as a result of a temporary variation in voltage or a sudden power failure. Besides, the radio receiver, in many cases, is arranged outside building, thus the cooling capacity of the cooler may change as an effect of a sudden variation in the outside temperature.

In this case, the problem is that the temperature of the band pass filter changes and its pass band frequency as well, thus the radio receiver does not perform a predetermined operation.

SUMMARY OF THE INVENTION

The present invention has been made in consideration of the above. It is accordingly an object of the present invention to provide an electronic equipment, which retains a temperature at which the electronic equipment can perform a predetermined operation, and which is not likely to be effected by some kind of temporary disturbance.

In order to achieve the above object, according to one aspect of the present invention, there is provided an electronic equipment comprising:

one or more electronic devices which are operable within a predetermined temperature range;

a cold stage which cools down said one or more electronic devices to such a predetermined operational temperature that said one or more electronic devices can perform a predetermined operation; and a cold insulation member whose phase transition temperature is in a range between the predetermined operational temperature and an upper limit of the predetermined temperature range, and which is arranged adjacent to said electronic device, and whose phase changes so as to retain a temperature of said one or more electronic devices within the predetermined temperature range, and wherein a part of said one or more electronic devices adjacent to said cold insulation member is formed from a material which is in a superconductive state at the predetermined operational temperature.

According to the above structure, while the phase of the cold insulation member is changing, the electronic equipment can retain the predetermined temperature at which the electronic device is operable, and a temporary disturbance is not likely to effect the operations of the electronic equipment.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

Preferred embodiments of the present invention will now be described with reference to the accompanying drawings.

First Embodiment

Figure 1:
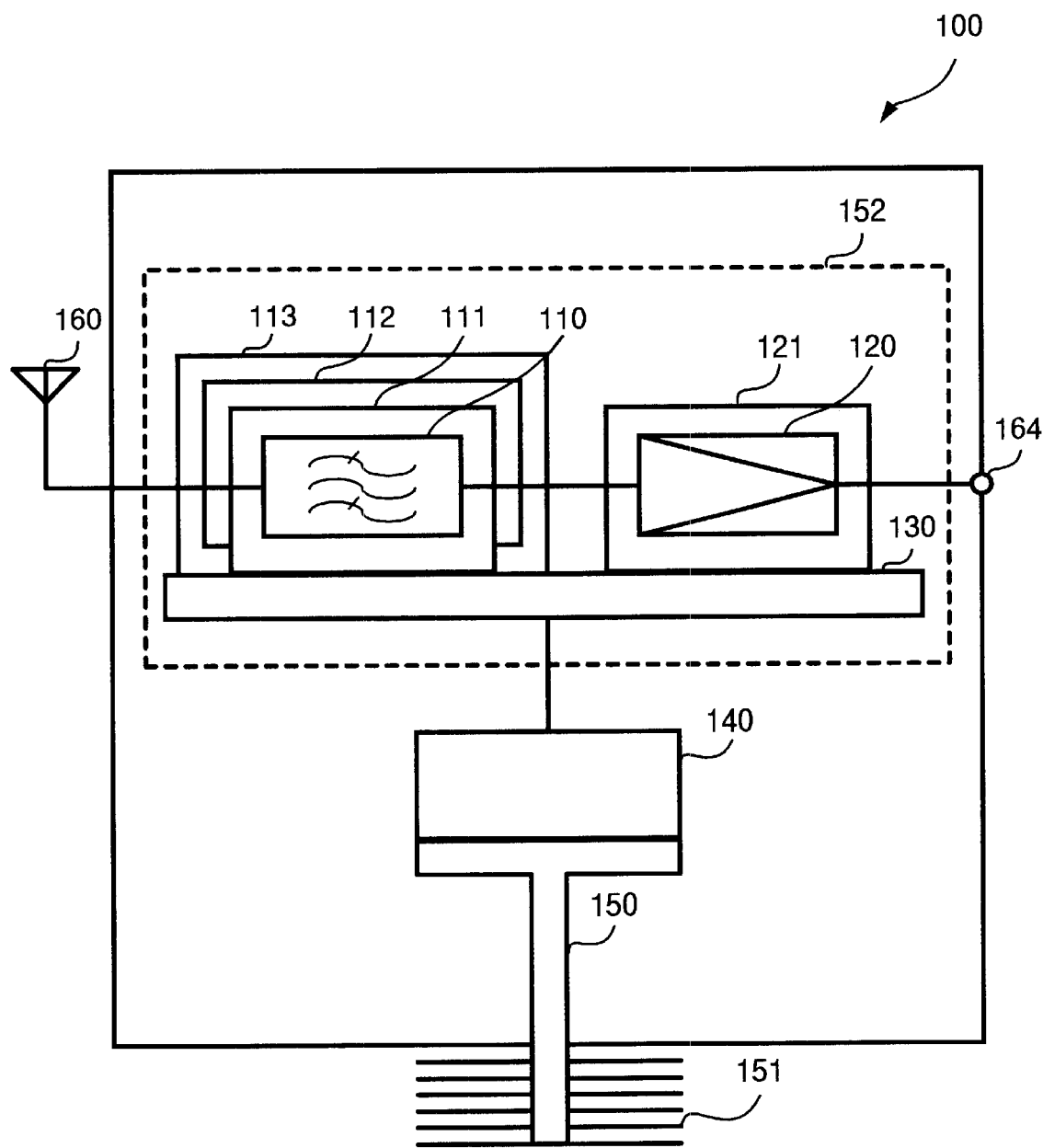
FIG. 1 is a block diagram showing the structure of a radio receiver according to the first embodiment of the present invention.
Figure 2:
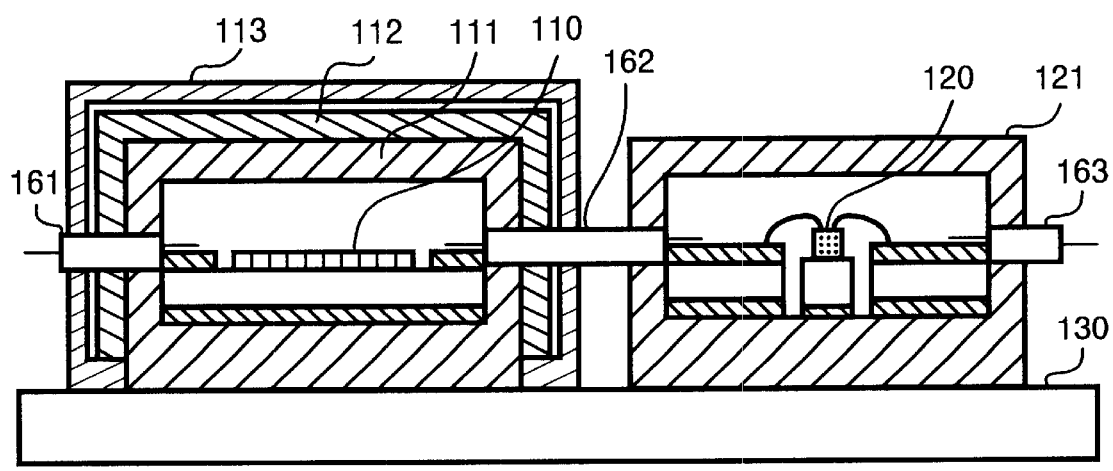
FIG. 2 is a cross sectional view showing the principal components of the radio receiver according to the first embodiment.

FIG. 1 is a structural diagram showing the structure of a radio receiver 100 according to the first embodiment of the present invention. FIG. 2 is a vertical cross sectional view schematically showing the principal components of the radio receiver 100.

The radio receiver 100 is used at a mobile communications or satellite communications base station, etc., and arranged at the top of an antenna tower, or the like.

As shown in FIG. 1, the radio receiver 100 comprises a band pass filter 110, a package 111, a cold insulation member 112, a cover 113, a low-noise amplifier 120, a package 121, a cold stage 130, a cooler 140 and a heat pipe 150.

The band pass filter 110 is a superconductor filter, and operates in a superconductive state. When the temperature is 58K (Kelvin), the band pass filter 110 is to select any signals at a particular frequency band from input signals.

The band pass filter 110 is required to operate within the temperature variation of 0.5K in this case.

The band pass filter 110 is made of a copper-oxide superconducting material, such as Y (yttrium), Bi (bismuth), Tl (thallium), Hg (mercury) whose critical temperature is higher than 80K.

The band pass filter 110 is contained in the package 111 having the cover 113. The cold insulation member 112 is inserted between the package 111 and the cover 113, and adhered to the outer surface of the package 111.

The cold insulation member 112 is one whose phase transition temperature is a degree of temperature at which the band pass filter 110 performs a predetermined operation. The cold insulation member is formed of, for example, KAl $(SO_4)_2$ $(12H_2O)$. The phase of KAl $(SO_4)_2$ $(12H_2O)$ changes at a temperature of 58K.

In the state where the phase of the cold insulation member 112 changes, the cold insulation member 112 can maintain the phase transition temperature with the transition heat, until the phase completely changes.

The low-noise amplifier 120 is made up of a semiconductor device with a compound semiconductor, and contained in the package 121. The low-noise amplifier 120 is arranged on the cold stage 130 together with the band pass filter 110, and amplifies signals output from the band pass filter 110 to a desired level.

The cold stage 130 is connected to the cooler 140, and retained to such a temperature (58K) that the band pass filter 110 arranged thereon performs a predetermined operation.

The cooler 140 is a Stirling cycle cooler which generates cold, if helium, etc. is expanded.

One end of a heat pipe 150 contact the cooler 140, and the other end thereof is projected from the radio receiver 100. The heat pipe 150 outputs heat generated by the cooler 140 from a heat output fin 151.

A heat shielding unit 152 comprises the band pass filter 110, the package 111, the cold insulation member 112, the low-noise amplifier 120, the package 121 and the cold stage 130, and is insulated from external heat.

The radio receiver 100 operates as follows:

The cooler 140 cools down the cold stage 130, and retains the band pass filter 110 on the cold stage 130 at a temperature of 58K.

In this state, a signal received by an antenna 160 is input to the band pass filter 110 through a connector 161 and a coaxial cable.

When the temperature of the band pass filter 110 is 58K, the band pass filter 110 selects any signal at a particular frequency band from those input signals, and outputs the selected signal to the low-noise amplifier 120 through a connector 162.

The low-noise amplifier 120 amplifies the signal output from the band pass filter 110 to a desired level and outputs the amplified signal to a received-signal output terminal 164 through a connector 163.

The radio receiver 100 is arranged outside a building, such as at the top of an antenna tower, etc., for example. Hence, the cooling capacity of the cooler 140 may change, if the outside temperature suddenly varies.

The cooler 140 continuously operates for a long period of time, for many years. Thus, the level of electric power to be input may change, due to a temporary variation in voltage or a sudden power failure.

As described, conventionally, the change in the cooling capacity of the cooler or in the level of the electric power has a direct effect on the conventional radio receiver. Hence, the temperature of the band pass filter varies together with the temperature of the cold stage.

For example, when the temperature of the band pass filter raises, the pass band of the band pass filter shifts to a frequency band which is lower than a predetermined frequency band. Thus, the band pass filter can not extract a signal at a desired frequency.

The change in the cooling capacity of the cooler or in the level of the electric power does not have much effect on the radio receiver of this embodiment, as follows:

For example, when the level of the electric power to be input to the cooler 140 decreases, the temperature of the cold stage 130 connected to the cooler 140 raises, and the temperature of the package 111 on the cold stage 130 also raises.

The phase of the cold insulation member 112 adhered to the package 111 begins to shift, when heat absorption is performed by the cold insulation member 112. While the phase transition state of the cold insulation member 112 is still in the process of changing, the temperature thereof does not vary.

Thus, the phase of the cold insulation member 112 completely changes, the temperature of the package 111 in contact with the cold insulation member 112 and the temperature of the band pass filter 110 contained in the package 111 are retained constant.

Further, before the phase of the cold insulation member 112 completely changes, if the electric power to be input to the cooler 140 recovers to a predetermined level and the temperature of the cold stage 130 returns to a temperature of 58K, the temperature of the band pass filter 110 stays 58K.

In the above circumstances, the frequency characteristics of the band pass filter 110 do not change, therefore, the radio receiver 100 can continuously perform a predetermined operation.

Second Embodiment

Figure 3:
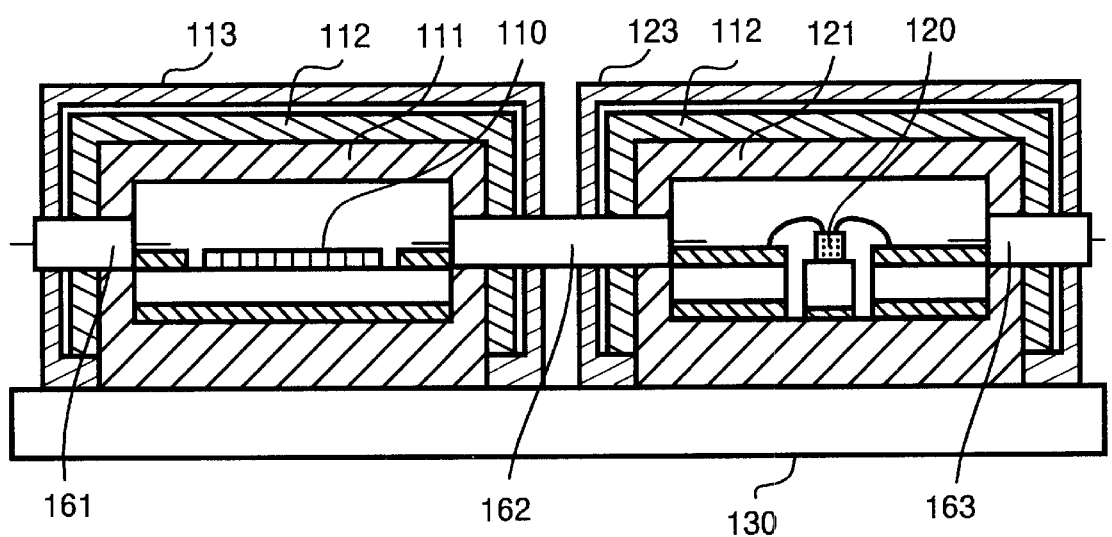
FIG. 3 is a cross sectional view showing the principal components of a radio receiver according to the second embodiment.

FIG. 3 is a cross sectional view showing the principal components of a radio receiver according to the second embodiment of the present invention.

The radio receiver of the second embodiment has substantially the same structure as that of the radio receiver of the first embodiment. The only the difference is that another cold insulation member is arranged on the outer surface of the package including the low-noise amplifier, in the structure of the radio receiver of the second embodiment.

Thus, the same component elements are denoted by the same reference numerals, and only differences between the radio receiver of the first and second embodiment will be explained.

As shown in FIG. 3, the low-noise amplifier 120 is contained in the package 121 having a cover 123. The cold insulation member 112 is inserted between the package 121 and the cover 123 and adhered to the outer surface of the package 121.

In a radio receiver 200 of this embodiment, when the cooling capacity of the cooler 140 changes or when the level of the electric power to be input changes, the phase of the cold insulation member 112 changes.

When the phase of the cold insulation member 112 is still in the process of changing, the temperature of the cold insulation member 112 does not change. Thus, the temperature of the package 121 and the temperature of the low-noise amplifier 120 in the package 121 are retained constant.

Hence, in the radio receiver 200, when the capacity of the cooler 140 changes or the level of input power changes, the low-noise amplifier 120 reduces a thermal noise occurring in the band pass filter 110, and can continuously perform an operation for amplifying a signal output from the band pass filter.

Third Embodiment

Figure 4:
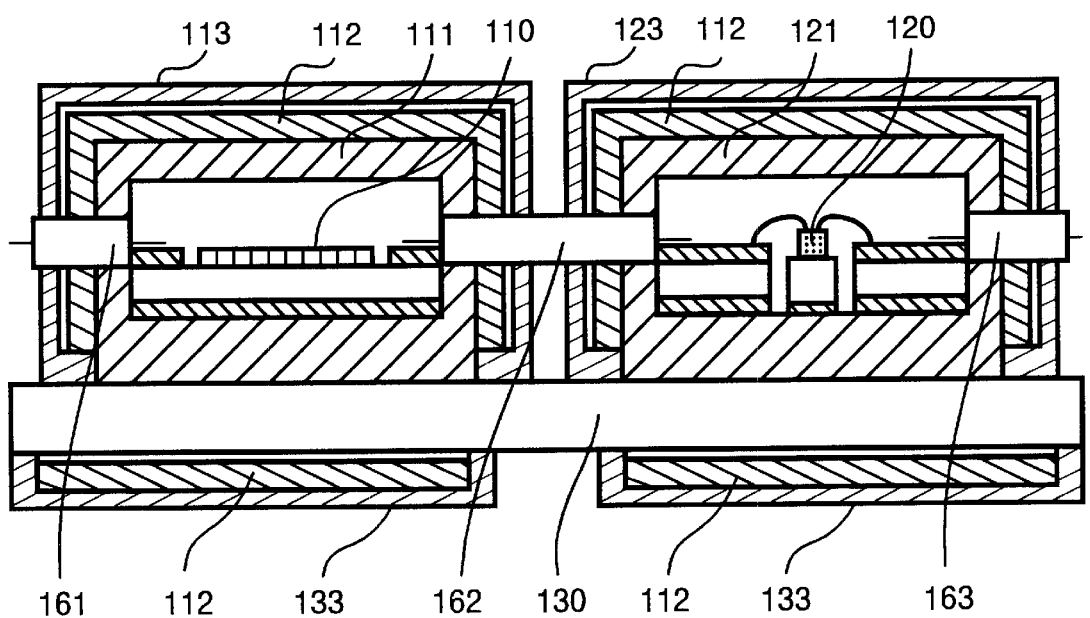
FIG. 4 is a cross sectional view showing the principal components of a radio receiver according to the third embodiment.

FIG. 4 is a cross sectional view showing the principal components of a radio receiver according to the third embodiment of the present invention.

The radio receiver of the third embodiment has substantially the same structure as that of the radio receiver of the second embodiment. The only the difference is that another cold insulation member is arranged on the outer surface of the cold stage, in the structure of the radio receiver of the third embodiment.

Thus, the same component elements are denoted by the same reference numerals, and only differences between the radio receiver of the second and third embodiments will be explained.

As illustrated in FIG. 4, the cold stage 130 includes a cover 133. The cold insulation member 112 is inserted between the cold stage 130 and the cover 133.

In a radio receiver 300 of this embodiment, when the cooling capacity of the cooler 140 changes or the level of input power changes, the phase of the cold insulation member 112 changes.

While the phase of the cold insulation member 112 is still in process of changing, the temperature of the cold insulation member 112 does not vary, hence, the temperatures of the package 111, package 112 and cold stage 130 are retained constant for a while.

The volume of the cold stage 130 is larger than the volume of the packages 111 and 121, and the thermal capacity of the cold stage 130 is also larger than that of the packages 111 and 121.

Thus, the temperature of the band pass filter 110 is retained constant for a longer period of time than the period of time the temperature of the band pass filter 110 in the radio receiver of the first and second embodiments is retained constant.

In this structure, the frequency characteristics of the band pass filter 110 do not change. Hence, the radio receiver 300 can continuously perform a predetermined operation.

Fourth Embodiment

In the third embodiment, when the cooling capacity of the cooler or the level of the electric power to be input to the cooler changes, the temperature of the band pass filter is retained constant for a long period time. In this structure, the cold insulation member is used a lot, and the radio receiver is made large in size. Now, explanations will be made to a radio receiver, according to the fourth embodiment, which is light in weight and formed in small.

Figure 5:
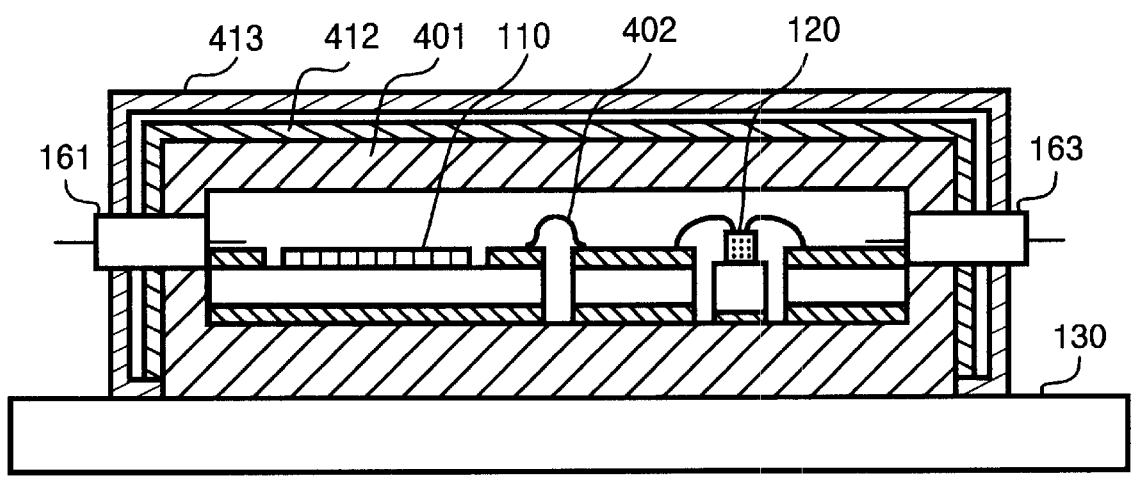
FIG. 5 is a cross sectional view showing the principal components of a radio receiver according to the fourth embodiment.

FIG. 5 is a cross sectional view showing the principal components of the radio receiver according to the fourth embodiment of the present invention. The same component elements are denoted by the same reference numerals as those of the elements included in the radio receiver of the first embodiment.

In a radio receiver 400, as shown in FIG. 5, the band pass filter 110 and the low-noise amplifier 120 are integrated with each other and contained in a single package 401.

The band pass filter 110 and the low-noise amplifier 120 are connected with each other through a bonding wire 402.

The package 401 is covered by a cover 413. A cold insulation member 412 is hermetically inserted between the package 401 and the cover 413, and is adhered to the outer surface of the package 401.

The cold insulation member 412 is formed of KCN whose phase transition temperature is 83K.

The band pass filter 110 operates at 83K at a certain frequency as a pass band.

When the cooling capacity of the cooler 140 or the level of the electric power to be input to the cooler 140 changes, the temperatures of the band pass filter 110 and low-noise amplifier 120 are respectively retained constant, until the phase of the cold insulation member 412 completely changes.

In this embodiment, no connector connecting the band pass filter 110 and the low-noise amplifier 120 is necessary. Hence, as compared to the radio receiver according to any one of the first to third embodiments, the radio receiver of this embodiment can be light in weight and formed small in size.

A modification may be made to the radio receiver of the fourth embodiment, by arranging the cold insulation member on the outer surface of the cold stage. When the cooling capacity of the cooler changes or the level of the electric power to be input to the cooler changes, the radio receiver of the modification can stably operate for a longer period of time than the period of time the radio receiver of the fourth embodiment can operate.

Fifth Embodiment

Figure 6:
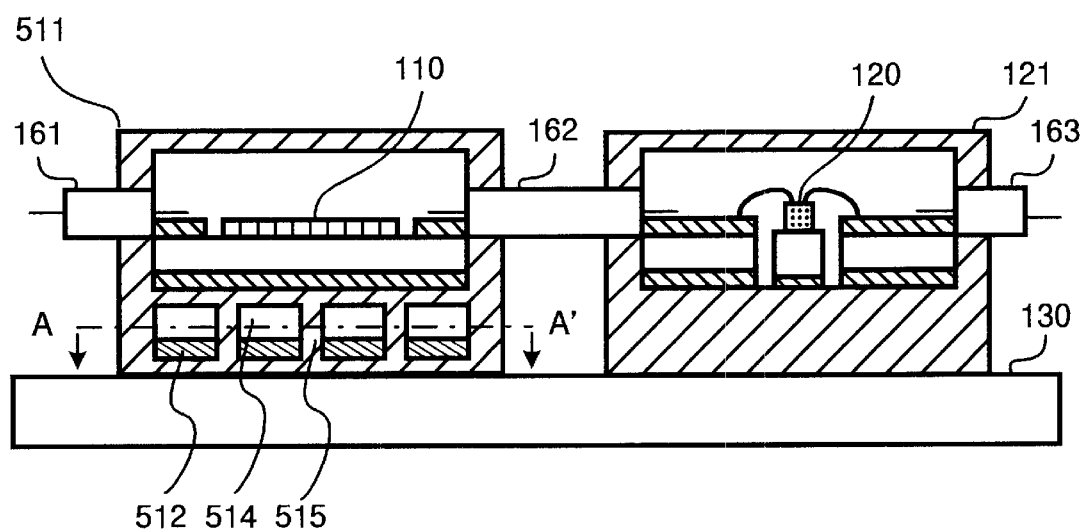
FIG. 6 is a cross sectional view showing the principal components of a radio receiver according to the fifth embodiment.

FIG. 6 is a cross sectional view showing the principal elements of a radio receiver according to the fifth embodiment of the present invention.

Figure 7:
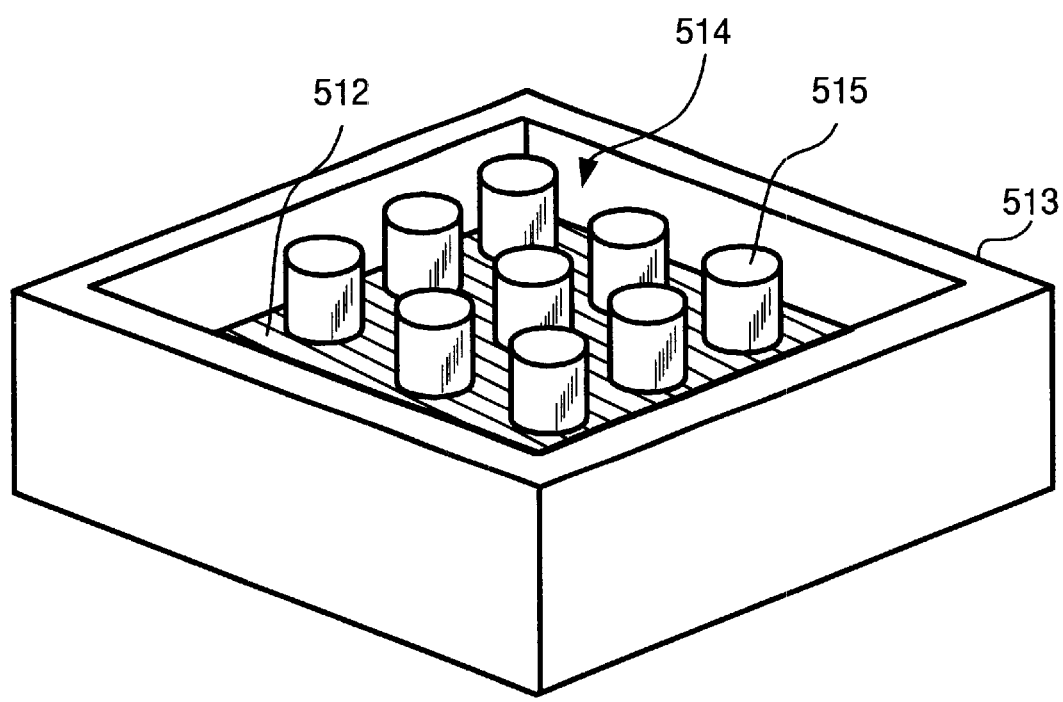
FIG. 7 is a perspective view showing the lower section of a package taken along a line A–A' of FIG. 6.

FIG. 7 is a perspective view of a lower section 513 of a package 511 taken along a line A–A' of FIG. 6.

A radio receiver 500 has basically the same structure as that of the first embodiment, as shown in FIG. 6, and the same component elements are denoted by the same reference numerals.

The difference in the structures of the first embodiment and the fifth embodiment is that a cold insulation member 512 is contained in a space 514 arranged inside the package 511, instead of being arranged on the outer surface of the package 511.

The lower section 513 of the package 511 includes a space 514 and a plurality of pillars 515. The plurality of pillars 515 are arranged at equal intervals in the space 514, as shown in FIG. 7.

The cold insulation member 512 is formed of $N_2$ in the form of a solid body which melts at a temperature of 63K so as to be liquified.

The band pass filter 110 operates at a temperature of 63K at a predetermined frequency band as a pass band.

The cold insulation member 512 is inserted in the space 514 in the package 511. After the phase of the cold insulation member 512 changes, the cold insulation, member 512 is liquified, and uniformly flows through the pillars 515.

In this structure, the cold insulation member 512 can uniformly transfer heat onto the band pass filter 110.

When the cooling capacity of the cooler 140 changes or the level of the electric power to be input to the cooler 140 changes, the temperature of the band pass filter 110 can be retained the same during the phase transition of the cold insulation member 512.

If the cold insulation member 512 is contained in the space of the package 121 of the low-noise amplifier 120 and the cold stage 130, the temperature of the band pass filter 110 can be retained the same for a longer period of time than the phase transition of the cold insulation member 512.

The cold insulation member 512 can be arranged on the outer surface of the package 511, package 121 and cold stage 130.

The preferred embodiments of the present invention have explained. However, the present invention is not limited to the above embodiments, and can be applied to a radio transmitter or a radio transceiver, and also to a general electronic device which operates at an extremely low temperature.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H11-356792 filed on Dec. 16, 1999, and including specification, claims, drawings and summary. The disclosure of the above Japanese Patent Application is incorporated herein by reference in its entirety.

What is claimed is:

1. An electronic equipment comprising:
   one or more electronic devices which are operable within a predetermined temperature range;
   a cold stage which cools down said one or more electronic devices to such a predetermined operational temperature that said one or more electronic devices can perform a predetermined operation; and
   a cold insulation member whose phase transition temperature is in a range between the predetermined operational temperature and an upper limit of the predetermined temperature range, and which is arranged adjacent to said electronic device, and whose phase changes so as to retain a temperature of said one or more electronic devices within the predetermined temperature range, and
   wherein a part of said one or more electronic devices adjacent to said cold insulation member is formed from a material which is in a superconductive state at the predetermined operational temperature.

2. An electronic equipment comprising:
   a plurality of electronic devices;
   a cold stage which cools down said plurality of electronic devices to a predetermined operational temperature;
   a cold insulation member, whose phase transition temperature is in a range between the predetermined operational temperature and an upper limit of a temperature range in which said plurality of electronic devices are operable, and whose phase changes so as to retain a temperature of said plurality of electronic devices at the phase transition temperature, and
   wherein
   one of said plurality of electronic devices is a filter, a part of which is formed from a material being in a superconductive state at the predetermined operational temperature, and which selects a signal from input signals at a predetermined frequency band,
   another electronic device is a low-noise amplifier which amplifies an output signal of the filter, and
   said cold insulation member is arranged adjacent to at least the filter, of said plurality of electronic devices.

3. The electronic equipment according to claim 2, further comprising
   a plurality of packages each of which contains one of said plurality of electronic devices, and
   wherein said cold insulation member is arranged on an outer wall of at least one of said plurality of packages which contains the filter.

4. The electronic equipment according to claim 3, wherein:
   each of said plurality of packages which contains the filter includes a cover; and
   a part of said cover is hermetically adhered to each of said plurality of packages which contains the filter, so that said cold insulation member does not flow from each of said plurality of packages with the filter.

5. The electronic equipment according to claim 3, wherein said cold insulation member is arranged on an outer wall of said cold stage.

6. The electronic equipment according to claim 5, wherein:
   said cold stage includes a cover; and
   said cover covers said cold insulation, and a part of said cover is hermetically adhered to said cold stage so that the cold insulation member does not flow from said cold stage.

7. The electronic equipment according to claim 2, further comprising a package containing said plurality of electronic devices, and
   wherein said cold insulation member is arranged on an outer wall of said package.

8. The electronic equipment according to claim 7, wherein:
   said package includes a cover; and
   a part of said cover is hermetically adhered to said package so that the cold insulation member does not flow from said package.

9. The electronic equipment according to claim 2, further comprising a plurality of packages respectively comprising said plurality of electronic devices, and
   wherein at least one of said packages which contains the filter has a space, which is filled with said cold insulation member, inside a wall forming a space for containing the filter.

10. The electronic equipment according to claim 9, wherein:
    a plurality of pillars are arranged in the space filled with said cold insulation member; and
    said cold insulation member in a form of a solid body is liquified during a phase transition of said cold insulation member, so as to flow between said plurality of pillars.

11. The electronic equipment according to claim 10, wherein said plurality of pillars are arranged at equal intervals in the space filled with said cold insulation member.

12. The electronic equipment according to claim 11, wherein the space filled with said cold insulation member is arranged between said cold stage and said plurality of electronic devices.

13. The electronic equipment according to claim 2, further comprising a package which contains said plurality of electronic devices, and wherein the package has a space, which is filled with said cold insulation member, inside a wall forming a space for containing the filter.

14. The electronic equipment according to claim 13, wherein:

a plurality of pillars are arranged in the space, which is filled with said cold insulation member; and said cold insulation member in a form of a solid body is liquified during a phase transition of said cold insulation member, so as to flow between said plurality of pillars.

15. The electronic equipment according to claim 14, wherein said plurality of pillars are arranged in the space which is filled with said cold insulation member.

* * * * *